United States Patent [19]

Yonehara et al.

[11] Patent Number: 5,422,302
[45] Date of Patent: Jun. 6, 1995

[54] METHOD FOR PRODUCING A THREE-DIMENSIONAL SEMICONDUCTOR DEVICE

[76] Inventors: Takao Yonehara, Atsugi; Masaharu Ozaki, both of c/o Canon Kabushiki Kaisha, 30-2, 3-chome, Shimomaruko, Ohta-ku, Tokyo, Japan

[21] Appl. No.: 974,340

[22] Filed: Nov. 10, 1992

Related U.S. Application Data

[63] Continuation of Ser. No. 569,734, Aug. 22, 1990, abandoned, which is a continuation of Ser. No. 298,266, Jan. 17, 1989, abandoned, which is a continuation of Ser. No. 67,545, Jun. 29, 1987, abandoned.

[30] Foreign Application Priority Data

Jun. 30, 1986 [JP] Japan ................... 61-153279
Jul. 11, 1986 [JP] Japan ................... 61-162130

[51] Int. Cl.$^6$ ..................... H01L 29/04; H01L 21/20
[52] U.S. Cl. ........................ 437/83; 437/89; 437/90; 437/106; 437/915; 437/57; 148/DIG. 164
[58] Field of Search ............... 437/81, 83, 85, 87, 437/88, 89, 90, 105, 106, 111, 915; 427/253, 38, 39; 148/DIG. 25, DIG. 26, DIG. 29, DIG. 59, DIG. 149, DIG. 152, DIG. 169, DIG. 164; 156/610, 612, 614, DIG. 64

[56] References Cited

U.S. PATENT DOCUMENTS

| | | |
|---|---|---|
| 3,403,439 | 10/1968 | Bailey . |
| 3,549,432 | 12/1970 | Sivertsen ................... 437/108 |
| 3,620,833 | 11/1971 | Gleim et al. ................ 437/83 |
| 3,900,943 | 8/1975 | Sirtl ........................ 437/83 |
| 4,131,496 | 12/1978 | Weitzel et al. ............. 156/613 |
| 4,174,422 | 11/1979 | Mathews et al. ............ 437/84 |
| 4,279,688 | 7/1981 | Abrahams et al. ........... 437/84 |
| 4,443,488 | 4/1984 | Little et al. . |
| 4,489,478 | 12/1984 | Sakurai ..................... 437/915 |
| 4,498,226 | 2/1985 | Inoue et al. ................ 437/915 |
| 4,507,158 | 3/1985 | Kamins et al. .............. 437/62 |
| 4,522,662 | 6/1985 | Bradbury et al. ........... 156/610 |
| 4,569,700 | 2/1986 | Toyama ..................... 437/51 |
| 4,578,142 | 3/1986 | Corboy, Jr. et al. ......... 437/89 |
| 4,592,792 | 6/1986 | Corby, Jr. et al. . |
| 4,637,127 | 1/1987 | Kurogi et al. .............. 437/89 |
| 4,685,199 | 8/1987 | Jastrzebski ................ 437/81 |
| 4,749,441 | 6/1988 | Christenson et al. ........ 156/612 |
| 5,008,206 | 4/1991 | Shinohara et al. .......... 437/83 |
| 5,010,033 | 4/1991 | Tokunaga et al. ........... 437/83 |
| 5,013,670 | 5/1991 | Arikawa et al. ............. 437/83 |
| 5,155,058 | 10/1992 | Fujiwara et al. ............ 437/915 |

FOREIGN PATENT DOCUMENTS

| | | | |
|---|---|---|---|
| 0056406 | 4/1983 | Japan ................... 437/915 |
| 0056456 | 4/1983 | Japan ................... 437/915 |
| 0090724 | 5/1983 | Japan ................... 437/915 |
| 0124222 | 7/1983 | Japan ................... 437/915 |

OTHER PUBLICATIONS

Claassen et al., "The Nucleation of CVD Silicon on $SiO_2$ and $Si_3N_4$ Substrates", J. Electrochem. Soc., vol. 127, No. 1, Jan. 1980, pp. 194–202.

Brice, *Crystal Growth Processes*, (John Wiley and Sons), Blackie and Son, Ltd., 1986, p. 75.

Jastrezebski, "SOI by CVD: Epitaxial Lateral Overgrowth (ELO) Process—A Review", J. of Crystal Growth, vol. 63, 1983, pp. 493–526.

Ohkura et al., "Orientation Controlled SOI by Line--Shaped Laser-Beam Seeded Lateral Epitaxy for CMOS Stacking", Japanese Journal of Applied Physics, 17th Conf. on Solid State Devices and Materials, Aug. 1985, pp. 143–146.

Blaem et al., "Nucleation and Growth of Silicon Films by Chemical Vapour Deposition", Philips Technical Review, vol. 41, No. 2, pp. 60–69 (1983–84).

*Primary Examiner*—Mary Wilczewski

[57] ABSTRACT

A semiconductor device has an insulated gate type transistor. The insulated gate type transistor is formed on an insulating surface of substrate.

The insulated gate type transistor is formed in a single crystal layer which is grown from a single nucleus formed on nucleation region which is provided on said insulating surface, which has sufficiently greater nucleation density than material of said insulating surface and which has sufficiently small size so that only one nucleus can be grown.

2 Claims, 12 Drawing Sheets

METHOD FOR PRODUCING A THREE-DIMENSIONAL SEMICONDUCTOR DEVICE

This application is a continuation of application Ser. No. 07/569,734, filed Aug. 22, 1990, now abandoned, which is a continuation application of Ser. No. 07/298,266, filed Jan. 17, 1989, abandoned, which is a continuation of application Ser. No. 07/067,545, filed Jun. 29, 1987, abandoned.

BACKGROUND OF THE INVENTION

1. Field of the Invention

The present invention relates to a semiconductor device with crystalline layer formed by utilizing selective nucleation method for selectively growing crystal using a difference in nucleation density of the deposited film forming materials according to the kinds of the deposited surface constituting materials.

2. Related Background Art

Since an integrated circuit device comprising an integrated circuit produced by forming a single crystal silicon on an insulating material substrate has small parasitic capacitance, it can operate in higher speed then the integrated circuit formed on a silicon substrate. Further, when a complementary MOS (C-MOS) integrated circuit is produced by the single crystalline silicon formed on the insulating material substrate, since no thyristor is formed by a parasitic bipolar transistor, there is no possibility of causing a latch up effect.

As the insulating material substrate for use in such integrated circuit device, a sapphire substrate has been used conventionally.

However, the sapphire substrate is more expensive than the silicon substrate. The sapphire substrate is applicable for only a limited use.

Further, in recent years, a method has been provided for forming a single crystalline film by covering the silicon substrate with insulating material, forming polycrystalline silicon film on the insulating material, and melting and recrystallizing the polycrystalline silicon with laser beam, and method for obtaining structure wherein the single crystalline silicon layer is on the insulating layer by implanting oxygen ion into the silicon substrate to form the insulating layer in the silicon substrate.

However, all of these methods require a process of very low producing efficiency such as process for melting the polycrystalline silicon with a laser beam and a process of a high dose of ion implantation with an ion implantation apparatus. Accordingly, there are problems that reducing the cost of the integrated circuit device is difficult and that, since it is difficult to get a high quality single crystalline silicon, a high performance integrated circuit can not be produced. While, in recent years, research and development of three dimensional integrated circuit, wherein semiconductor elements are formed in a configuration of layers stacked on the substrate is a direction normal to the substrate thereby high integration density and multifunction are achieved, are executed.

In order to achieve the three dimensional integrated circuit, it is necessary to form the semiconductor thin film for producing the electronic elements such as transistors on amorphous insulating material. However, in general, on the amorphous material, only amorphous silicon or polycrystalline silicon can be grown.

Therefore, in the prior art methods are classified as method wherein the amorphous or polycrystalline silicon is directly used as the semiconductor layers for producing the electronic elements, or method wherein the grown amorphous or polycrystalline silicon is method with laser beam or the like to be crystallized as a single crystal and the crystallized single crystal is used as the semiconductor layers of the electronic element.

However, when the amorphous or polycrystalline silicon is directly used as a semiconductor layer for producing the electronic elements, there are problems that the electron mobilities obtained is small (approximately ~0.1 cm$^2$/V.sec for amorphous; approximately 1~10 cm$^2$/V.sec for polycrystalline silicon with particle size of few hundreds of angstroms), and that leakage current is large even if a PN junction is formed. Accordingly, high performance electronic elements can not be produced.

While, according to the method wherein the grown amorphous or polycrystalline silicon is melted and recrystallized, since the single crystal layer is used as the semiconductor layer for producing the electronic elements, high performance electronic elements can be obtained. However, since the silicon layer is heated by the laser beam to be melted, there is a problem that the heating adversely affects the performance of the elements formed under the silicon layer.

SUMMARY OF THE INVENTION

An object of the present invention is to provide the semiconductor device and method for producing the same wherein the problems of the prior art as described in the above are solved.

Another object of the present invention is to provide multi-layer structure semiconductor device with high performance elements using single or polycrystal, and method for producing the same easily and with high reliability.

Further object of the present invention is to provide a semiconductor device and a method for producing the same wherein, on an underlayer wherein desired elements and/or wirings are formed, a layer with deposition surface is formed directly on the underlayer or in the configuration of sandwiching another layer therebetween the underlayer and the layer with deposition surface. On the deposition surface ($S_{NDS}$), a deposition surface ($S_{NDL}$) of a material having sufficiently greater nucleation density than the nucleation density of a material forming the deposition surface ($S_{NDS}$) and being sufficiently fine so that only a single nucleus being grown is provided. In a crystalline layer grown from the single nucleus grown on the deposition surface ($S_{NDL}$), at least a desired element is formed.

Still further object of the present invention is to provide a semiconductor device and method for producing the same. The semiconductor device has an insulated gate type transistor. The insulated gate type transistor is formed on a surface of the insulating material, the surface of which is at least insulating. A single crystal layer forming the insulated gate type transistor is produced by providing nucleation base having sufficiently greater nucleation density than the insulating material and being sufficiently fine so that only one nucleus is grown, and growing the single crystal from the one nucleus grown on the nucleation base.

BRIEF DESCRIPTION OF THE DRAWINGS

FIGS. 6-2A and 6-2B are perspective views of the substrates in FIGS. 6-1A to 6-1D;

FIGS. 8-1A to 8-1C are illustrations of formation steps showing a fourth embodiment of the method for forming crystal relating to the present invention;

FIGS. 8-2A and 8-2B are perspective views of the substrates in FIGS. 8-1A to 8-1C;

DETAILED DESCRIPTION OF PREFERRED EMBODIMENTS

For better understanding of the present invention, first the general process for forming a thin film of metal for semiconductor is explained.

When the deposition surface is made of a material different in kind from the flying atom, particularly an amorphous material, the flying atoms are diffused freely on the substrate surface, or again evaporated (released). And, as the result of collision mutually between the atoms, a nucleus is formed and when its size becomes the size rc ($= -2\ \sigma o/gv$) at which its free energy G becomes the maximum (critical nucleus), G is reduced and the nucleus continues to grow stably three-dimensionally to become shaped in an island. The nucleus with the size exceeding rc is called stable nucleus, and unless otherwise particularly noted, "nucleus" in the following basic description of the present invention refers to this "stable nucleus". Also, among "stable nucleus", those with small r are called "initial nucleus".

The free energy generated by formation of nucleus is represented as follows:

$$G = 4\pi f(\theta)\ (\sigma o\ r^2 + \tfrac{1}{3}.gv.r^3)\ f(\theta) = \tfrac{1}{4}(2 - 3\cos\theta + \cos^2\theta)$$

wherein, r: radius curvature of nucleus
  $\theta$: contact angle of nucleus
  gv: free energy per unit deposition
  $\sigma o$: surface energy between nucleus and vacuum.

Figure 1:
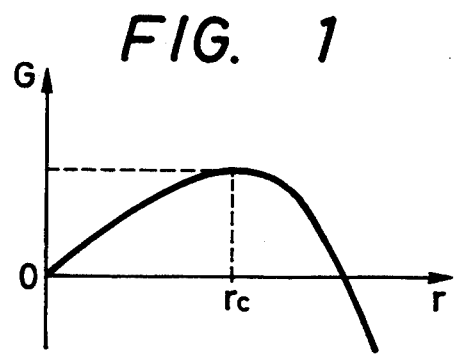
FIG. 1 is a graph for illustration of the relationship between the size of nucleus rc and free energy G in the process of forming thin film.

FIG. 1 shows the manner in which G is changed. In the same Figure, the radius of curvature of the stable nucleus when G is at the maximum value is rc.

Thus, nuclei grow to become shaped in islands, and further grow whereby contact mutually between islands progresses until sometimes coalescence occurs and via a network structure, it becomes finally a continuous film to cover completely over the substrate surface. Following such a process, a thin film is deposited on the substrate.

In the deposition process as described above, the density of nucleus formed per unit area of the substrate surface, the size of nucleus and the nucleation speed are determined depending on the state of the system of deposition, and particularly the interaction between the flying atoms and the substrate surface material is an important factor. Also, a specific crystal direction grows in parallel to the substrate due to anisotropy relative to the crystal surface of the interface energy at the interface between the deposited material and the substrate, and when the substrate is amorphous, the crystal direction within the substrate plane is not constant. For this reason, grain boundaries are formed by collision mutually between nuclei or islands, and particularly in the case of collision mutually between islands with some sizes or greater, grain boundaries are formed as such rather than occurrence of coalescence. Since the grain boundaries formed are difficult to move in the solid phase, the grain sizes are determined at that point.

Next, the selective deposition method for forming a deposited film selectively on the deposition surface is to be described. The selective deposition method is a method in which a thin film is formed selectively on the substrate by utilizing the differences between the materials in factors influencing nucleus formation in the thin film forming process such as surface energy, attachment coefficient, release coefficient, surface diffusion speed, etc.

Figure 2A:
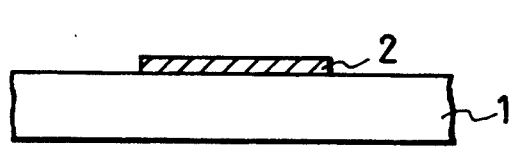
FIGS. 2A and 2B are illustrations of the selective deposition method.
Figure 2B:
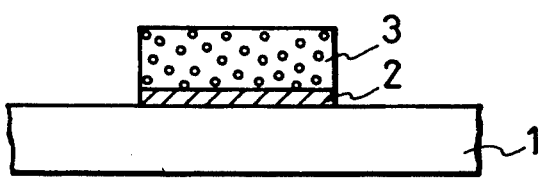

FIGS. 2A and 2B are illustrations of the selective deposition method. First, as shown in FIG. 2A on the substrate 1, a thin film 2 comprising a material different in the above factors from the substrate 1 is formed at a desired portion. And, when deposition of a thin film comprising an appropriate material is effected under appropriate deposition conditions, a thin film 3 grows only on the thin film 2, whereby it is possible to give rise to a phenomenon that no growth occurs on the substrate 1. By utilizing this phenomenon, the thin film 3 formed self-matching can be grown, whereby it becomes possible to omit the lithographic step by use of a resist as practiced in the prior art.

As the material for enabling deposition according to such selective formation method, for example, $SiO_2$ may be used as the substrate 1, Si, GaAs, silicon nitride as the thin film 2 and Si, W, GaAs, InP, etc., as the thin film 3 to be deposited.

Figure 3:
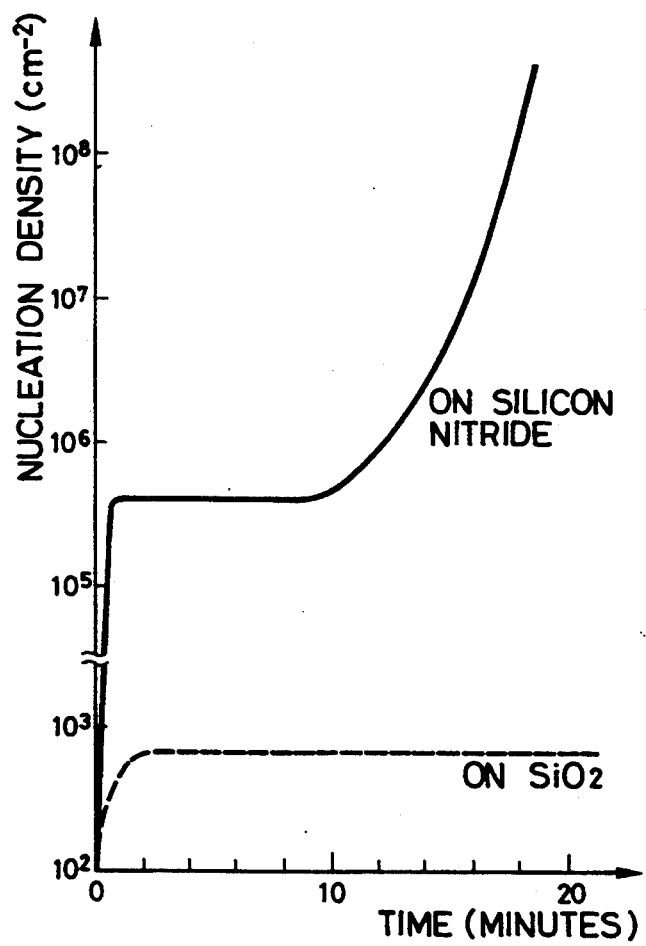
FIG. 3 is a graph showing the change with lapse of time of nucleation density (ND) on the deposition surface of SiO$_2$ and the deposition surface of silicon nitride.

FIG. 3 is a graph showing the change with lapse of time of nucleation density on the deposited surface of $SiO_2$ and the deposited surface of silicon nitride.

As shown in the same graph, soon after initiation deposition, the nucleation density on $SiO_2$ is saturated at $10^3$ cm$^{-2}$ or less, and the value is not substantially changed even after 20 minutes.

In contrast, on silicon nitride $(Si_3N_4)$, it is once saturated at about $4 \times 10^5$ cm$^{-2}$ or less, is not substantially changed 10 minutes thereafter, but is abruptly increased thereafter. This measurement example shows the case in which $SiCl_4$ gas is diluted with $H_2$ and deposited according to the CVD method under the conditions of a pressure of 170 Torr and a temperature of 1000° C. Otherwise, the same action can be obtained by use of $SiH_4$, $SiH_2Cl_2$, $SiHCl_3$, $SiF_4$, etc., as the reaction gas, and controlling the pressure, temperature, etc. Also, the vacuum vapor deposition can be employed.

In this case, nucleation on $SiO_2$ poses substantially no problem, but by addition of HCl gas into the reaction gas, nucleation on $SiO_2$ can be further suppressed to make deposition of Si on $SiO_2$ perfectly zero.

Such a phenomenon depends greatly on the difference in adsorption coefficient, release coefficient, surface diffusion coefficient, etc., relative to Si of the material surfaces of $SiO_2$ and silicon nitride, but the fact that $SiO_2$ itself is etched by the reaction of $SiO_2$ with Si atom itself to form silicon monooxide with higher vapor pressure, while no such etching phenomenon occurs on silicon nitride may be also considered to be a cause to effect selective deposition (T. Yonehara, S. Yoshioka, S. Miyazawa, Journal of Applied Physics 53, 6839, 1982).

Thus, by selecting $SiO_2$ and silicon nitride as the materials of the deposition surface and silicon as the material to be deposited, sufficiently great nucleation density difference as shown in the same graph can be obtained. Here, although $SiO_2$ is desirable as the material for the deposition surface, this is not limitative and sufficiently practical nucleation density difference can be obtained even by use of $SiO_x$ ($0 < x < 2$).

Of course, the present invention is not limited to these materials, but the difference in nucleation density ($\Delta ND$) may be sufficiently $10^3$-fold or more in density of nuclei as shown by the same graph, and sufficient selective formation of deposited film can be done with the materials as exemplified below.

As another method for obtaining this nucleation density difference (AND), ions of Si or N may be injected locally into the $SiO_2$ surface to form a region having excessive Si or N.

The present invention utilizes selective deposition based on such nucleation density difference ($\Delta ND$) and, by forming sufficiently finely so that a single nucleus may grow on the deposition surface of a different kind of material having sufficiently greater nucleation density than the material of the deposition surface, a single crystal can be grown selectively only at the site where such fine different kind of material exists.

In this connection, since selective growth of a single crystal is determined depending on the electron state of the deposition surface, particularly the state of dangling bonds, the material with lower nucleation density (for example, $SiO_2$) is not required to be a bulk material, but it may be formed only on the surface of any desired material, substrate, etc., to form the above deposited surface.

In the following, the present invention is described in detail by referring to the drawings.

Figure 4A:
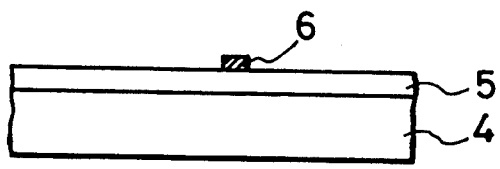
FIGS. 4A to 4D are illustrations of the formation steps showing a first embodiment of the method for forming crystal relating to the present invention.
Figure 4B:
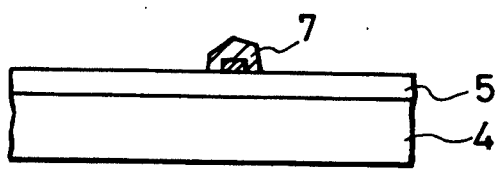
Figure 4C:
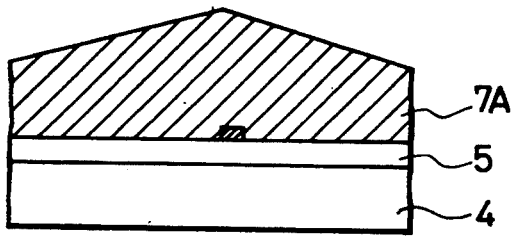
Figure 4D:
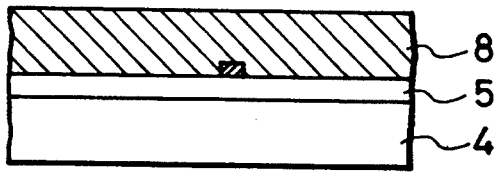
Figure 5A:
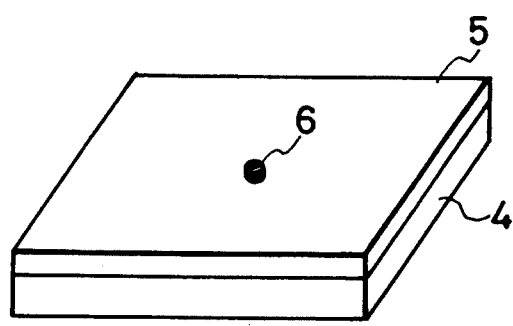
FIGS. 5A and 5B are perspective views of the substrate in FIGS. 4A to 4D.
Figure 5B:
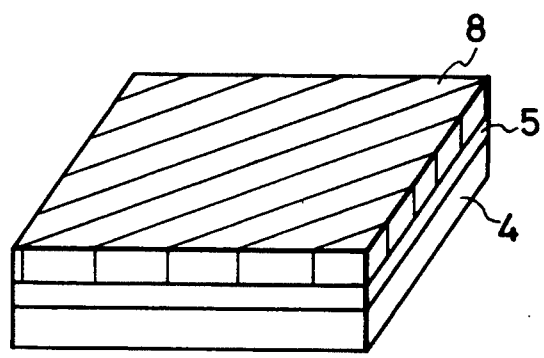

FIGS. 4A to 4D are illustrations of the formation steps showing a first embodiment of the method for forming crystal relating to the present invention, and FIGS. 5A and 5B are perspective views of the substrates in FIGS. 4A and 4D. First, as shown in FIG. 4A and FIG. 5A, on the substrate 4, a thin film 5 [deposition surface ($S_{NDS}$)] with small nucleation density which enables selective deposition is formed and a material different from the material forming the thin film 5 with greater nucleation density is deposited thinly, followed by patterning according to lithography, etc., to form a sufficiently fine deposition surface 6 ($S_{NDL}$) (or called "Seed") comprising a different kind of material. However, the size, the crystal structure and the composition of the substrate 4 may be any desired ones, and a substrate having a functional device formed thereon prepared according to conventional semiconductor technique may be employed. Also, the deposition surface ($S_{NDL}$) 6 comprising a different kind of material is also inclusive of modified regions having excessive Si or N formed by ion injection of Si or N into the thin film 5 as described above.

Next, by selection of appropriate deposition conditions, a single crystal of a thin film material is formed only on the deposition surface ($S_{NDL}$) 6. That is, the deposition surface ($S_{NDL}$) 6 is required to be formed sufficiently finely so that only a single nucleus may be formed thereon. The size of the deposition surface ($S_{NDL}$) 6, which may differ depending on the kind of the material, may be several microns or less. Further, the nucleus grows while maintaining a single crystal structure to become a single crystal grain 7 in shape of an island as shown in FIG. 4B. For forming an island-shaped single crystal grain 7, it is desirable to determine the conditions so that no nucleation may occur at all on the thin film 5, as already mentioned.

The island-shaped single crystal grain 7 further grows while maintaining the single crystal structure with the deposition surface ($S_{NDL}$) 6 as the center (lateral overgrowth), whereby it can cover over the whole thin film 5 as shown in FIG. 4C (single crystal 7A).

Subsequently, if necessary, the single crystal 7A is flattened by etching or polishing, and a single crystal layer 8 capable of forming a desired device can be formed on the thin film 5 as shown in FIG. 4D and FIG. 5B.

For forming thus the thin film 5 forming the nonnucleation surface ($S_{NDS}$) on the substrate 4, any desired material can be used for the substrate 4 which is the supporting member. Further, in such a case, even when the substrate 4 may be one having a functional device, etc., formed thereon according to conventional semiconductor technique, the single crystal layer 8 can be easily formed thereon.

In the above embodiment, the nonnucleation surface ($S_{NDS}$) is formed of thin film 5, but a substrate comprising a material with small nucleation density (ND) enabling selective nucleation may be used as such and nucleation surfaces ($S_{NDL}$) may be provided at any desired positions to form single crystal layers similarly thereon.

Figures 1A, 6:
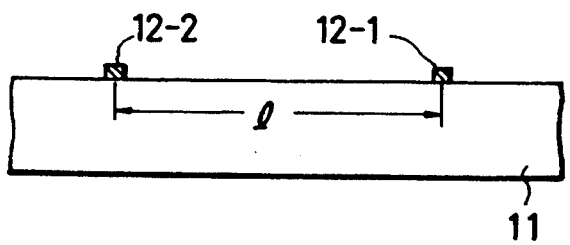
FIGS. 6-1A to 6-1D are illustrations of the formation steps showing a second embodiment of the method for forming single crystal relating to the present invention.
Figures 1B, 6:
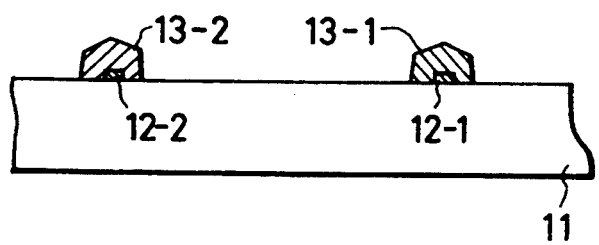
Figures 1C, 6:
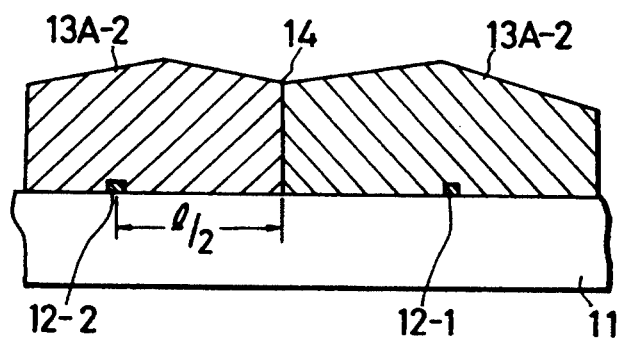
Figures 1D, 6:
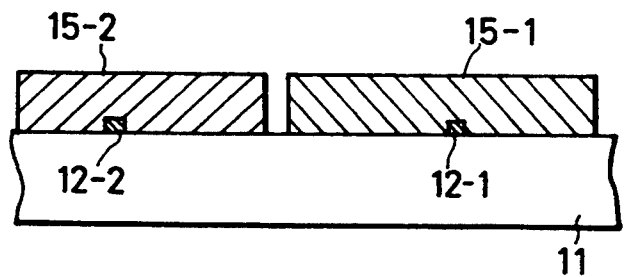
Figures 2A, 6:
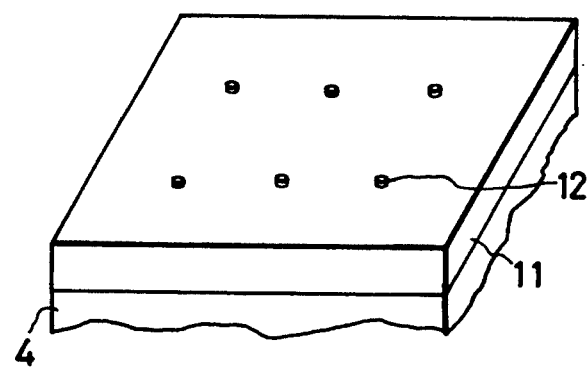
Figures 2B, 6:
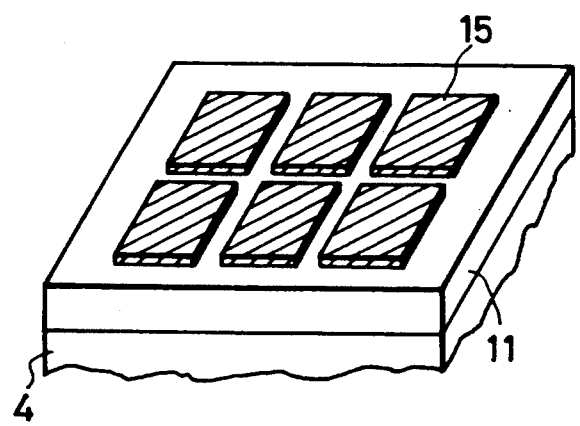
Figure 7A:
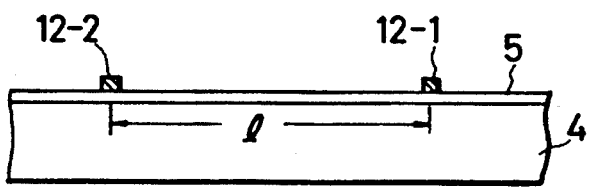
FIGS. 7A to 7D are illustrations of the steps for forming crystal showing a third embodiment of the method for forming crystal relating to the present invention.
Figure 7B:
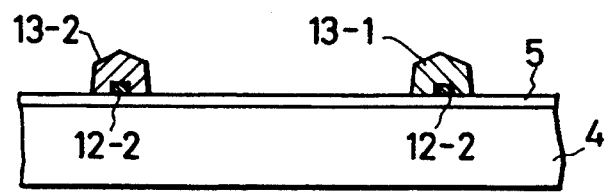
Figure 7C:
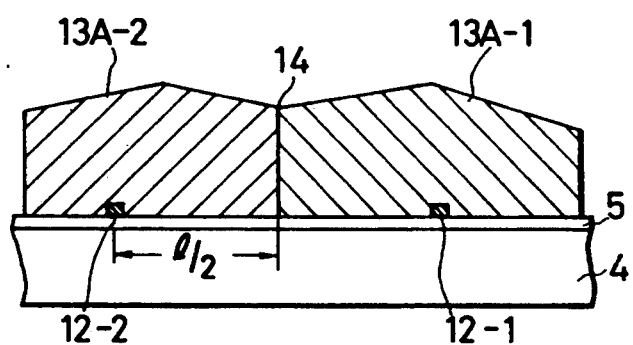
Figure 7D:
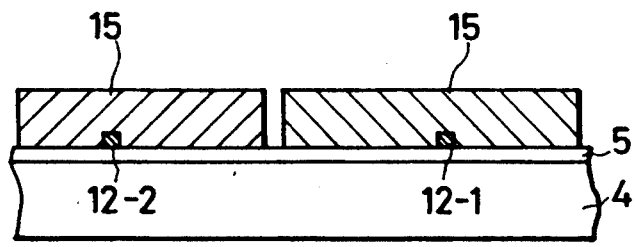

FIGS. 6-1A–6-1D are illustrations of the formation steps showing a second embodiment of the method for forming crystal relating to the present invention, and FIGS. 6-2A and 6-2B are perspective views of the substrates in FIGS. 6-1A and 6-1D.

As shown in FIG. 6-1A and 6-2A, on the amorphous insulating substrate 11, with an interval of a distance l, nucleation surfaces ($S_{NDL}$) 12-1, 12-2 of a material different from the substrate 11 enabling the above selective nucleation are arranged sufficiently finely. The distance l is set equal to the size of the single crystal region required for formation of semiconductor device or group of devices or greater.

Next, by selecting appropriate crystal forming conditions, on the nucleation surfaces ($S_{NDL}$) 12-1, 12-2 only a nucleus of a crystal forming material is formed. That is, the nucleation surfaces 12-1, 12-2 are required to be formed to a sufficiently fine size (area) to the extent that only a single nucleus may be formed. The size of the nucleation surfaces ($S_{NDL}$) 12-1, 12-2, which may be different depending on the kind of the material, may be several microns or less. Further, the nucleus grows while maintaining the single crystal structure, and become island-shaped single crystal grains 13-1, 13-2 as shown in FIG. 6-1B. For forming island-shaped single crystal grains 13-1, 13-2, it is desirable to determine the conditions so that no nucleation may occur at all on other surfaces than the nucleation surfaces ($S_{NDL}$) on the substrate 11.

The crystal direction in the normal line direction of the substrate 11 of the island-shaped single crystal grains 13-1, 13-2 is determined so as to make the interface energy of the material of the substrate 11 and the material forming nucleus minimum. For, surface or interface energy has anisotropy depending on the crystal face. However, as already mentioned, the crystal direction within the substrate plane in amorphous substrate is not determined.

The island-shaped single crystal grains 13-1, 13-2 further grow to become single crystals 13A-1, 13A-2 until the adjacent single crystals 13A-1, 13A-2 contact each other as shown in FIG. 6-1C, but since the crystal direction within the substrate plane is not constant, a crystal grain boundary 14 is formed at the intermediate position between the nucleation surfaces ($S_{NDL}$) 12-1 and 12-2.

Subsequently, the single crystals 13A-1, 13A-2 grow three-dimensionally, but crystal faces with slow growth speed appear as the fact. For this reason, the surfaces of single crystals 13A-1, 13A-2 are flattened by etching or polishing, and further the portion of the grain boundary 14 is removed to form thin films of single crystals 15-1, 15-2 containing no grain boundary in shape of lattices as shown in FIG. 6-1D and FIG. 6B. The size of the single crystal films 15-1, 15-2, 15 is determined by the interval l between the nucleation surfaces ($S_{NDL}$) as described above. That is, by determining appropriately the formation pattern of the nucleation surface ($S_{NDL}$) 12, the position of the grain boundary can be controlled to form single crystals with desired sizes at a desired arrangement.

FIGS. 7A–7D are illustrations of the steps for forming crystal showing a third embodiment of the method for forming crystal relating to the present invention. As shown in these figures, similarly as in the first embodiment, a nonnucleation surface ($S_{NDS}$) 5 shaped in a thin film comprising a material with small nucleation density (ND) enabling selective nucleation is formed on a desired substrate 4, and nucleation surfaces ($S_{NDL}$) 12 comprising a different material with greater nucleation density (ND) are formed at intervals of l thereon, whereby single crystal layers 15 can be formed similarly as in the above third embodiment.

Figures 1A, 8:
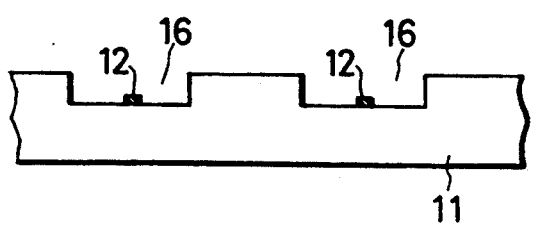
Figures 1B, 8:
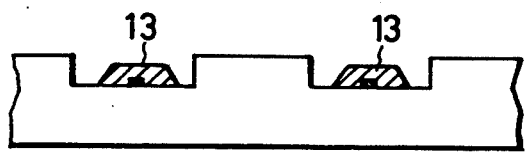
Figures 1C, 8:
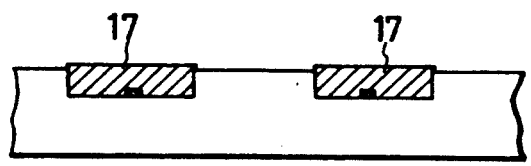
Figures 2A, 8:
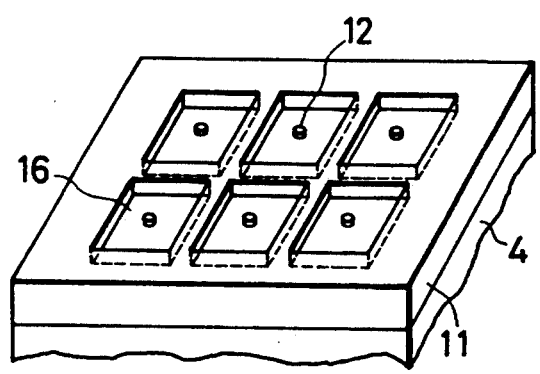
Figures 2B, 8:
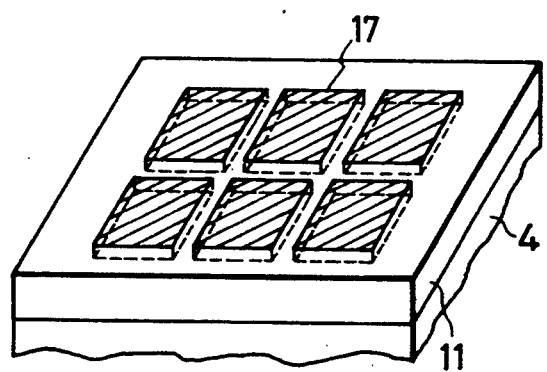

FIGS. 8-1A–8-1C are illustrations of the formation steps showing a fourth embodiment of the method for forming crystal relating to the present invention, and FIGS. 8-2A and 8-2B are perspective views of the substrates in FIGS. 8-1A and 8-1C First, as shown in FIG. 8-1A and FIG. 8-2A, concavities 16 with desired size and shape are formed on the amorphous insulating substrate 11, and nucleation surfaces ($S_{NDL}$) 12 with sufficiently fine size for forming only single nuclei are formed therein.

Subsequently, as shown in FIG. 8-1, island-shaped single crystal grains 13 are grown similarly as in the first embodiment.

And, as shown in FIG. 8-1C and FIG. 8-2B, single crystal grains 13 are grown until embedding the concavity 16 to form a single crystal layer 17.

In this embodiment, since single crystal grains 13 grow within the concavity 16, the steps of flattening and removing the grain portion become unnecessary.

Figure 9A:
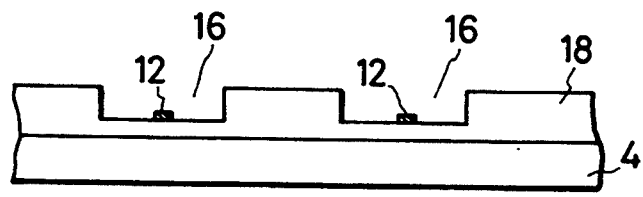
FIGS. 9A to 9C are illustrations of the steps for forming crystal showing a fifth embodiment of the method for forming crystal relating to the present invention.
Figure 9B:
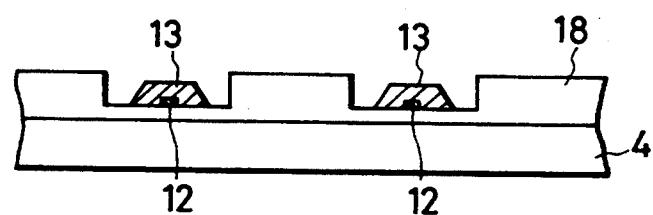
Figure 9C:
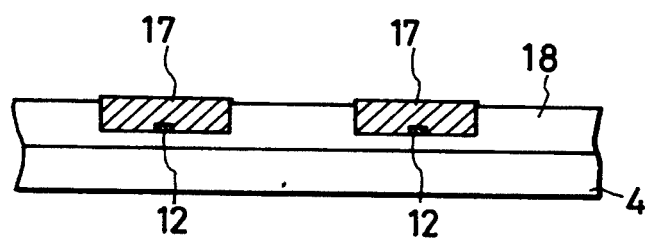

FIGS. 9A–9C are steps for forming crystal showing a fifth embodiment of the present invention. As shown in the same Figure, on any desired substrate 4 similarly as in the first embodiment, a nonnucleation surface ($S_{NDS}$) shaped in thin film 18 comprising a material with small nucleation density (ND) enabling selective nucleation is formed, and a concavity 16 with desired size and shape is formed thereon. And, a nucleation surface ($S_{NDL}$) 12 comprising a material different from the material forming the nonnucleation surface ($S_{NDS}$) with greater nucleation density (ND) is formed therein, and a single crystal layer 17 is formed similarly as in the fifth embodiment.

FIGS. 10A–10D are illustrations of the steps for forming crystal showing an sixth embodiment of the present invention.

Figure 10A:
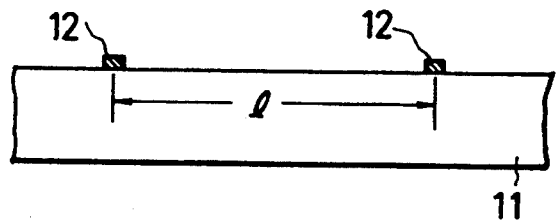
FIGS. 10A to 10D are illustrations of the steps for forming crystal showing a sixth embodiment of the method for forming crystal relating to the present invention.
Figure 10B:
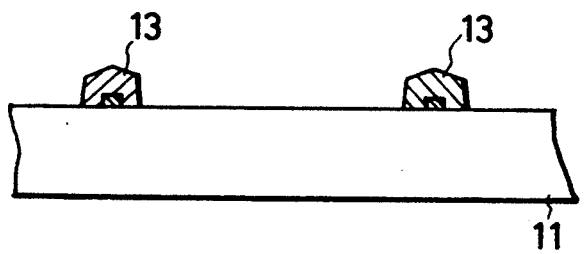
Figure 10C:
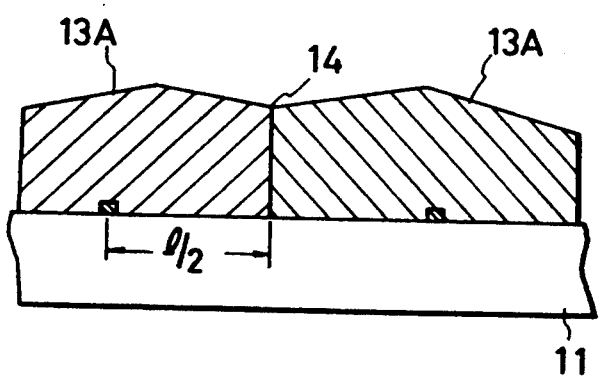
Figure 10D:
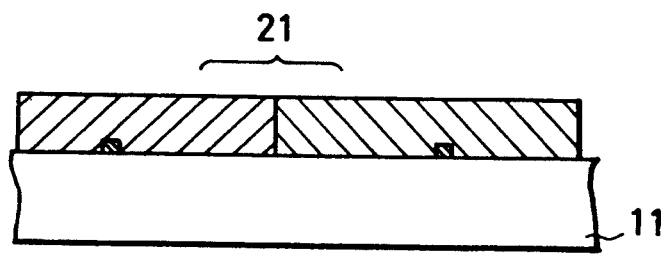

FIGS. 10A–10C are the same as FIGS. 6-1A– 6-1C. That is, a plurality (two in the Figure) of nucleation surfaces 12 are formed with an interval of l, and single crystal grains 13 subjected to overgrowth on the nucleation surfaces 12 are formed. By permitting the single crystal grains 13 to further grow to form single crystals 13A, a grain boundary 14 is formed approximately at the center between the nucleation surfaces ($S_{NDL}$), and by flattening the surface of single crystal 13A, a polycrystalline layer 21 with regular grains sizes which are approximately equal to l as shown in FIG. 10 can be obtained.

Since the grain size of the polycrystalline layer 21 is determined by the interval l between the nucleation surfaces ($S_{NDL}$) 12, it becomes possible to control the grain size of the polycrystal. In the prior art, the grain size of a polycrystal was changed by a plural number of factors such as the formation method, formation temperature, etc., and also when preparing a polycrystal with large grain size, it had a grain size distribution with a considerable width. However, according to the present invention, the grain size and grain size distribution can be determined with good controllability by the interval l between the nucleation surfaces 12.

Of course, as shown in FIG. 9, the above polycrystal layer 21 may be formed by forming a nonnucleation surface ($S_{NDS}$) 5 with small nucleation density (ND) on a desired substrate 4 and nucleation surfaces ($S_{NDL}$) 12-1, 12-2 with greater nucleation density (ND). In this case, as already mentioned, the substrate material and structure are not limited, but the polycrystal layer 21 can be formed by controlling the grain size and the grain size distribution.

Next, the specific method for forming a single crystal layer or a polycrystal layer in the above respective embodiments is described in more detail by referring primarily to the third embodiment shown in FIG. 6-1 and the eighth embodiment shown in FIG. 10.

By thermal oxidation of a Si single crystal wafer to form $SiO_2$ on the surface, a substrate 11 is obtained with its surface being formed into nonnucleation surface ($S_{NDS}$). Of course, a quartz substrate which is a material with small nucleation density (ND) can be also used as the substrate 11, or alternatively a nonnucleation surface ($S_{NDS}$) may be provided by forming an $SiO_2$ layer on the surface of any desired base substrate such as metal, semiconductor, magnetic material, piezoelectric material, insulator, etc., by use of the sputtering method, the CVD method, the vacuum vapor deposition method, etc. Also, as the material forming nonnucleation surface ($S_{NDS}$), $SiO_2$ is desirable, but $SiO_x$ ($0<x<1$) with the value of x being varied may be also employed.

On the $SiO_2$ layer of the substrate 11 having $SiO_2$ layer thus formed on the surface is deposited as silicon nitride layer (e.g. $Si_3N_4$ layer) or a polycrystalline silicon layer according to the reduced pressure chemical vapor deposition method, and subsequently the silicon nitride layer or polycrystalline silicon layer is subjected to patterning according to conventional lithographic technique or lithographic technique by use of X-ray, electron beam or ion beam, whereby nucleation surfaces ($S_{NDL}$) 12 having fine area of preferably 10 μm or less, more preferably several micron or less, optimally about 1 μm or less, are obtained.

Subsequently, by use of $SiH_2Cl_2$, $SiCl_4$, $SiHCl_3$, $SiF_4$ or $SiH_4$, or a gas mixture of these, optionally mixed with HCl, $H_2$ or a gas mixture of these, Si single crystal is selectively grown on the about substrate 11.

The substrate temperature, pressure, etc., may be conveniently determined, but the substrate temperature may be preferably 700° to 1100° C., and the pressure may be preferably about 100 Torr.

Within a time of abut some 10 minutes, by selection of optimum growth conditions, grains 13 of single crystals of Si grow on the nucleation surfaces ($S_{NDS}$) 12 comprising silicon nitride layer or polycrystalline silicon layer on the $SiO_2$ layer as the center, and grow to sizes of some 10 μm or more.

Subsequently, by the reactive ion etching (RIE) method utilizing the etching speed difference between Si and $SiO_2$, the surface of the single crystal 13A is flattened by selective etching of only Si, whereby a polycrystalline silicon layer 21 controlled in grain size can be formed (FIG. 10 D). Further, by removing the grain boundary portion, an island-shaped single crystalline silicon layer 15 is formed (FIG. 6-1D). If unevenness on the surface of the single crystal grain 13 is large, mechanical polishing may be conducted before etching. When an electrical field effect transistor is formed according to conventional semiconductor device preparation technique on the single crystal silicon layer 15 thus formed with a size of some 10 μm or more containing no grain boundary, characteristics not inferior to that formed on single silicon wafer are exhibited.

Also, mutual interference between the adjacent single crystal silicon layers 15 can be prevented, if they are electrically separated by an electrical insulator such as $SiO_2$, even complementary type electrical field effect transistors (C-MOS) may be constituted.

Also, since the thickness of the active layer of the device formed is thinner than the case when employing Si wafer, there is no erroneous actuation by the charges generated when irradiated by radiation. Further, due to lowering in unwanted capacity, speed-up of the device can be effected. Also, since any desired substrate can be used, a single crystal layer can be formed on a substrate of large area at lower cost than when employing Si wafer. Further, since a single crystal layer can be formed also on other semiconductors, piezoelectric materials, dielectric materials, etc., a multi-functional three-dimensional integrated circuit can be realized. Thus, the present invention exhibits a number of excellent effects.

Composition of Silicon Nitride

For obtaining sufficient nucleation density difference ($\Delta ND$) between the material for formation of nonnucleation surface ($S_{NDS}$) and the material for formation of nucleation surface ($S_{NDL}$) as described above, for polycrystalline silicon or $SiO_2$ as the material for formation of nonnucleation surface ($S_{NDS}$) to be used in combination, the material for formation of nucleation surface ($S_{NDL}$) is not limited to $Si_3N_4$, but silicon nitrides with various chemical composition ratios may be employed.

The chemical composition ratio of silicon nitride may be varied as follows.

In the plasma CVD method for forming silicon nitride film at low temperature by decomposition of $SiH_4$ gas and $NH_3$ gas in RF plasma, by varying the flow rate ratio of $SiH_4$ gas and $NH_3$ gas, the composition ratio of Si and N in the deposited silicon nitride film can be varied to a great extent.

Figure 11:
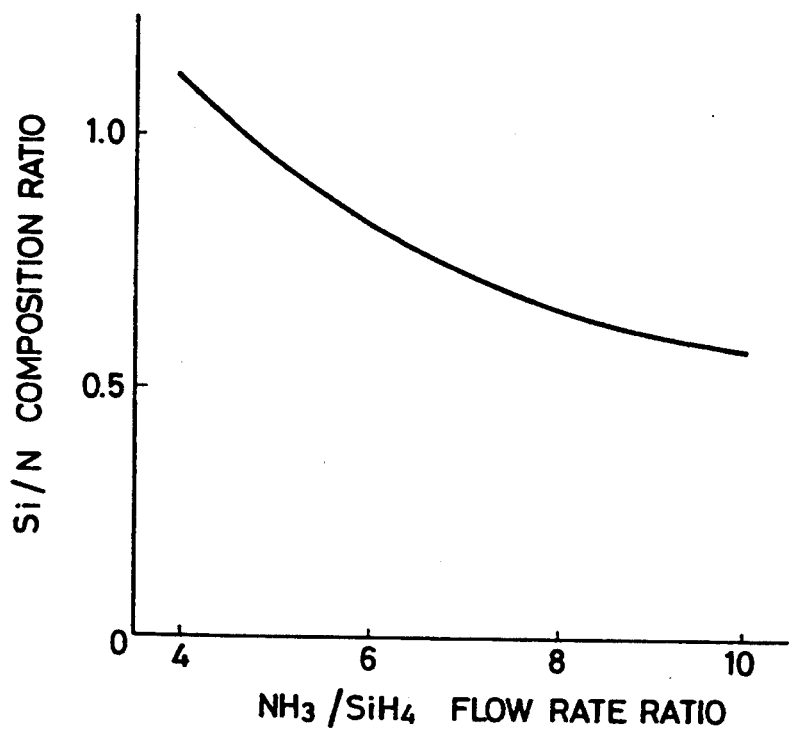
FIG. 11 is a graph showing the relationship between the flow rate of SiH$_4$ and NH$_3$ and the composition ratio of Si and N in the silicon nitride film formed.

FIG. 11 is a graph showing an example of the relationship between the flow rate ratio of $SiH_4$ and $NH_3$ and the composition ratio of Si and N in the silicon nitride film formed.

The deposition conditions at this time were RF output of 175 W, substrate temperature of 380° C. and the flow rate of $NH_3$ gas was varied with the $SiH_4$ gas flow rate being fixed at cc/min. As shown in the same graph, by varying the gas flow rate ratio of $NH_3/SiH_4$ from 4 to 10, the Si/N ratio in the silicon nitride film was found to be varied from 1.1 to 0.58 according to Auger's electron spectrophotometry.

On the other hand, the composition of the silicon nitride film formed according to the reduced pressure CVD method by introducing $SiH_2Cl_2$ gas and $NH_3$ gas under the conditions of a reduced pressure of 0.3 Torr and a temperature of about 800° C. was found to be $Si_3N_4$ (Si/N=0.75) which is approximately the stoichiometric ratio.

Also, the silicon nitride film formed by heat treatment at about 1200° C. in ammonia or $N_2$ (hot nitrification method) can be obtained with a composition further approximate to the stoichiometric ratio, since the formation method is performed under thermal equilibrium.

By use of silicon nitrides formed by the various methods as described above as the material for forming nucleation surface ($S_{NDL}$) with higher nucleation density than $SiO_2$, the above nucleus of Si can be grown on the nucleation surface ($S_{NDL}$) comprising silicon nitride to form Si single crystal based on the nucleation density ($\Delta ND$) corresponding to the chemical composition ratio of silicon nitride.

Figure 12:
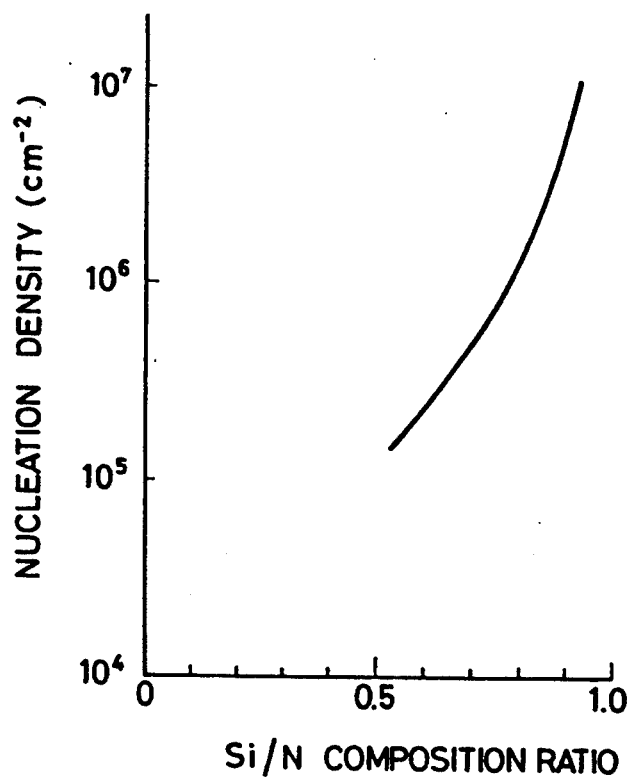
FIG. 12 is a graph showing the relationship between Si/N composition ratio and nucleation density.

FIG. 12 is a graph showing the relationship between Si/N composition ratio and nucleation density ($\Delta ND$). As shown in the same graph, by varying the chemical composition ratio of the silicon nitride film, the nucleation density of the Si single crystal nucleus formed thereon changes to a great extent. The nucleation conditions in the graph shown in FIG. 17 correspond to the case when Si single crystal nucleus was formed by reacting $SiCl_4$ gas reduced to 175 Torr with $H_2$ at 1000° C. Of course, another graph will be obtained if nucleation conditions such as gas species, pressure, temperature, etc., are changed.

The phenomenon that the nucleation density thus changes according to the chemical composition ratio of silicon nitride affects the size (area) of the nucleation surface ($S_{NDL}$) when employing silicon nitride as the material for forming the nucleation surface ($S_{NDL}$) which is formed sufficiently finely to the extent that a single nucleus may be grown. That is, when employing silicon nitride having a composition with great nucleation density (ND) only a single crystal can be formed on the nucleation surface ($S_{NDL}$) by forming the nucleation surface ($S_{NDL}$) extremely finely as compared with the silicon nitride with relatively smaller nucleation density (ND). Such a point is applicable as a similar tendency for other materials for forming nucleation surface ($S_{NDL}$). Accordingly, in the present invention, for accomplishing its objects effectively, it is desirable to select a nucleation density (ND) and a size of nucleation surface ($S_{NDL}$) formed of silicon nitride, etc., capable of forming only a single crystal suitably as desired. For example, under the nucleation condition for obtaining a nucleation density (ND) of about $10^5$ $cm^{-2}$ or less, it is possible to form selectively, only a single nucleus, if the size of the nucleation surface ($S_{NDL}$) comprising silicon nitride is about 4 $\mu m$ or less. The Si/N ratio in that case is about 0.5.

Formation of nucleation surface ($S_{NDL}$) by ion injection

As another method for realizing nucleation density difference when forming Si single crystal nucleus, ion injection of Si, N, P, B, F, Ar, He, C, As, Ga, Ge, etc., may be effected locally onto the surface comprising $SiO_2$ which is a material for forming nonnucleation surface ($S_{NDS}$) with smaller nucleation density to form a modified region with a desired size on the $SiO_2$ surface, and utilize this modified region as the nucleation surface ($S_{NDL}$) with greater nucleation density (ND).

For example, the $SiO_2$ layer surface is covered with a photoresist layer and the desired portions are exposed, developed and dissolved to have the $SiO_2$ layer surface exposed.

Subsequently, by use of $SiF_4$ gas as the source gas, Si ions are implanted onto the $SiO_2$ layer surface exposed at 10 keV at a density of $1 \times 10^{16} \sim 1 \times 10^{18}$ $cm^{-2}$. The projected flying distance in this case is 114 Å, and the Si concentration on the exposed surface of $SiO_2$ layer reaches about $10^{22}$ $cm^{-3}$ or less. Since the $SiO_2$ layer is originally amorphous, the modified layer made excessively enriched in Si by injection of Si ions is also amorphous.

For formation of a modified region, ion injection can be effected with the use of a resist as the mask, but it is also possible to inject a narrowed Si ion beam selectively at a desired position on the $SiO_2$ layer surface within a desired area without use of a resist mark by use of converged ion beam technique.

After having thus effected Si ion injection, by peeling of the resist on the remaining portion, Si-excessive modified region is formed on the $SiO_2$ layer surface at a desired position with a desired size. On the modified region of the $SiO_2$ layer surface having such modified region formed, Si single crystal is permitted to grow in vapor phase.

Figure 13:
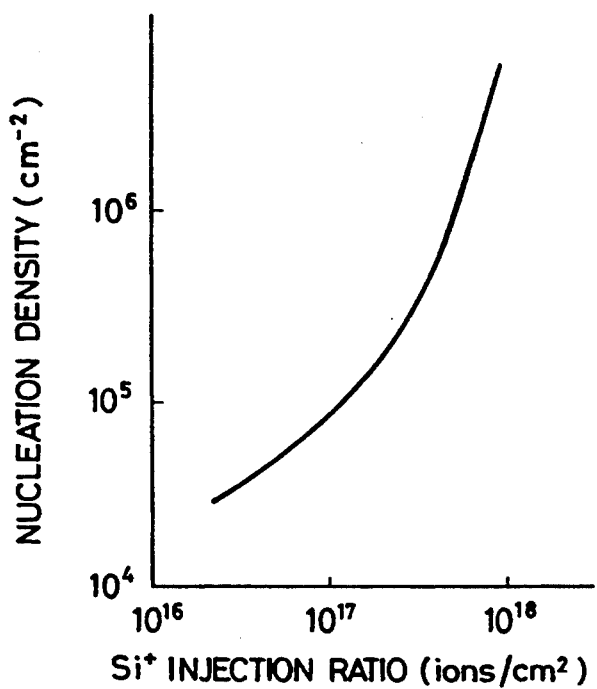
FIG. 13 is a graph showing the relationship between the injected amount of Si ions and nucleations density.

FIG. 13 is a graph showing the relationship between amount of Si ions injected and nucleation density (ND).

As shown in the same graph, it can be understood that nucleation density (ND) is increased as the amount of $Si^+$ injected is more.

Accordingly, by forming a modified region sufficiently finely, only a single nucleus of Si can be grown with the modified region being as the nucleation surface ($S_{NDL}$), whereby a single crystal can be grown as described above.

It can be easily accomplished by patterning of a resist or narrowing of beam of the converged ion beam to form sufficiently finely the modified region to the extent that only a single nucleus may grow.

Method for Formation of Si Single Crystal Nucleus Other than CVD

For growth of single crystal by selective nucleation of Si, not only the CVD method, but also the method by evaporation of Si into vacuum ($<10^{-6}$ Torr) with an electron gun and deposition on a heated substrate may be used. Particularly, in the MBE (Molecular Beam Epitaxy) method which performs vapor deposition in ultra-high vacuum ($<10^{-9}$ Torr), it has been known that Si beam begins to react with $SiO_2$ at a substrate temperature of 900° C. or higher, whereby no nucleation of Si occurs on $SiO_2$ at all (T. Yonehara, S. Yoshioka and S. Miyazawa, Journal of Applied Physics 53, 10, p. 6839, 1983).

By utilizing this phenomenon, single crystal nuclei of Si can be formed with perfect selectivity on the fine silicon nitride regions permitted to exist in spots on the $SiO_2$ layer, and single crystal Si can be grown thereon. The single crystal growth conditions as preferable example at this time may be, for example, a vacuum degree of $10^{-8}$ Torr or lower, Si beam intensity of $9.7 \times 10$-atoms/$cm^2$.sec, and a substrate temperature of 900° C.~1000° C.

In this case, through the reaction $SiO_2 + Si \rightarrow 2SiO \uparrow$, a reaction product of SiO with a remarkably high vapor pressure is formed, and etching of $SiO_2$ itself with Si through this evaporation occurs.

In contrast, no such etching phenomenon as mentioned above occurs on silicon nitride, but nucleation of Si single crystal and growth of single crystal occur.

Accordingly, as the material for forming nucleation surface ($S_{NDL}$) with high nucleation density (ND), tantalum oxide ($Ta_2O_5$), silicon nitride oxide (SiON), etc., can be also used other than silicon nitride to obtain the same effect. That is, by forming the above nucleation surface ($S_{NDL}$) with these materials in fine areas, single crystals of Si can be permitted to grow similarly.

Crystal Growth of Material Other than Si (1) As the crystalline material other than Si, the case of diamond is shown as an Example, as already mentioned, it has been desired to apply a diamond thin film as the semiconductor for electronic device, it has been impossible in the prior art to grow a diamond single crystal on a material other than the diamond substrate.

However, according to the crystal growth method according to the present invention, a diamond single crystal can be easily grown on a material other than diamond substrate. Here, explanation is made about an example of forming a single crystal of diamond by utilizing the fact that no single crystal nucleus of diamond grows on the surface of a metal such as Fe or Co.

First, on a desired base substrate, a metal layer of Fe or Co is formed by the vacuum vapor deposition method. In this case, the metal layer becomes a polycrystalline structure. This metal layer forms the nonnucleation surface ($S_{NDS}$) with lower nucleation density (ND) as mentioned in the present specification.

Subsequently, on the above metal layer, a metal such as Cu, W, Ta, Mo, Au, Ti, Al, Ni, etc., is deposited according to the vacuum vapor deposition method, or a semiconductor material such as Si, Ge, GaAs, InP, SiC, etc., according to the CVD method or the vacuum vapor deposition method. These metal and semiconductor materials are materials having sufficiently higher nucleation density as compared with the above metal layer. Subsequently, this metal or semiconductor layer is subjected to patterning to a size of several micrometer to form a nucleation surface ($S_{NDL}$) with a sufficiently fine area. Alternatively, the nucleation surface ($S_{NDL}$) comprising the above metal or semiconductor material may be formed by ion injection of the material as mentioned previously.

Thus, diamond is crystallized on the metal layer where nucleation surface exists under the following conditions.

As the method for crystallization of diamond, there may be employed the CVD method according to the microwave plasma CVD method, the hot filament method, etc. As the starting gases, for example, there may be employed gas mixtures of methane ($CH_4$) and hydrogen (1~10%), or hydrocarbons having alcoholic OH groups, specifically methyl alcohol $CH_3OH$, ethyl alcohol $C_2H_5OH$, tert-butyl alcohol $(CH_3)_3OH$, isopropyl alcohol $(CH_3)_2CHOH$, diethyl ether $C_2H_5OC_2H_5$, etc., by bubbling these liquids with hydrogen gas.

In the case of the plasma CVD method, it can be practiced, for example, under the conditions of a microwave output of 200 to 350 W, a substrate temperature of 500° to 1000° C. and a reduced pressure of 1 to 400 Torr.

In the case of the CVD method by use of the hot filament method, it can be practiced, for example, under the conditions of a filament temperature of about 1500° to 2000° C. and a filament-substrate distance of 0.5 to 10 min.

As the result, no nucleation of diamond occurs at all on the metal layer of Fe or Co, but only a single diamond single crystal nucleus is formed on the nucleation surface ($S_{NDL}$) with higher nucleation density (ND) finely formed on its surface, and thereafter diamond grains of single crystals grow to the sizes of some 10 μm to some 100 μm with the single diamond nuclei as their centers. In these diamond grains, there may sometimes exist internally the twin crystal grain boundaries without unpaired electrons depending on the crystal forming conditions, but there exists no grain boundary containing much unpaired electrons as found in the so called polycrystalline structure. This is because growth of a diamond single crystal from a single nucleus formed on the nucleation surface ($S_{NDL}$) is not inhibited due to absence of formation of diamond nucleus on the nonnucleation surface ($S_{NDS}$) formed of a material such as Fe or Co with lower nucleation density.

Figure 14:
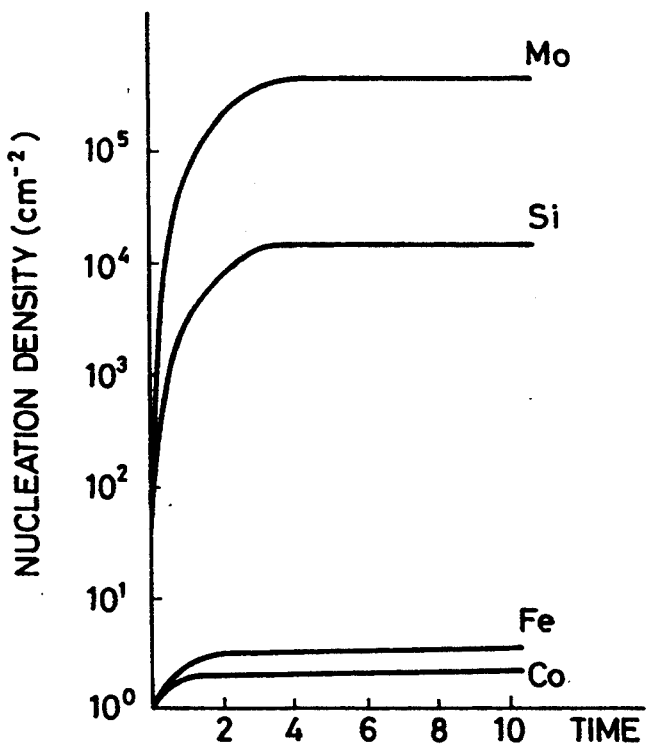
FIG. 14 is a graph showing the time dependency of nucleation density of diamond nuclei on Fe, Co, Si and Mo.

FIG. 14 is a graph showing the time dependency of nucleation density of the diamond on the surface of Fe, Co, Si, Mo.

As shown in this graph, it is possible to take sufficiently a difference in nucleation density of diamond on the surface of a metal of Fe, Co and on the surface of Si, Mo. This point is the same as in the case of nucleation density of Si on the surface of $Si_3N_4$ and on the surface of $SiO_2$ shown in FIG. 3.

Thus, by forming a layer for formation of nonnucleation surface ($S_{NDS}$) with lower nucleation density (ND) on the base substrate of any desired material other than diamond substrate, and forming nucleation surface ($S_{NDL}$) with higher nucleation density (ND) thereon to a sufficiently fine area, diamond single crystal can be formed with ease. Of course, as already mentioned, it is possible to form a diamond thin film of a polycrystalline structure with controlled grain size by arranging nucleation surfaces ($S_{NDL}$) having fine areas at desired intervals.

Also, according to the present invention, as the base substrate, it may be a substrate of the material capable of forming the above nonnucleation surface ($S_{NDS}$), and therefore the selection scope can be broadened to a great extent to accomplish low cost and enlargement of area with ease.

(2) Growth of tungsten single crystal

Tungsten has been known to effect no nucleation on the surface of $SiO_2$ layer, but to be deposited as a polycrystalline film on Si, $WSi_2$, PtSi, Al, etc.

First, on the substrate such as glass composed mainly of $SiO_2$, quartz, $SiO_2$ hot oxide film (all of these form nonnucleation surface ($S_{NDS}$) ), Si, $WSi_2$, PtSi or Al is deposited by vacuum vapor deposition, and subjected to patterning to a size of several μm or less by photolithography to form a desired number of nucleation surfaces ($S_{NDL}$).

Subsequently, the above substrate is placed in, for example, a reaction furnace heated to 250°~500° C., and a gas mixture of $WF_6$ gas and hydrogen gas is permitted to flow under a reduced pressure of about 0.1 to 10 Torr, at the respective flow rates of 75 cc/min and 10 cc/min.

By doing so, tungsten is formed as represented by the reaction scheme $WF_6 + 3H_2 \rightarrow W + 6HF$. In this case, the reactivity of tungsten with $SiO_2$ is extremely low to give no firm bonding, and therefore no nucleation occurs on the $SiO_2$ surface and hence no deposition is effected.

In contrast, on the above nucleation surface ($S_{NDL}$) formed of Si, $WSi_2$, PtSi, Al, etc., single crystal nuclei of tungsten are formed single crystal nuclei of tungsten singly, because nucleation surfaces ($S_{NDL}$) are formed finely. And, the single crystal of tungsten continues to grow and also grows as such single crystal also in the lateral direction on $SiO_2$. This is because nonnucleus growth of tungsten occurs on $SiO_2$, whereby no polycrystal is formed by interference of single crystal growth.

The combination of the nonnucleation surface ($S_{NDS}$) forming material, nucleation surface ($S_{NDL}$) forming material and crystal forming material as described above is not limited to those shown in the above embodiments, but it may be clearly a combination of materials having sufficient nucleation density difference. Accordingly, also in the case of a compound semiconductor capable of selective nucleation such as GaAs, InP, etc., a single crystal, a group of single crystals or a polycrystal controlled in grain size and grain size distribution can be formed according to the present invention.

Figure 15:
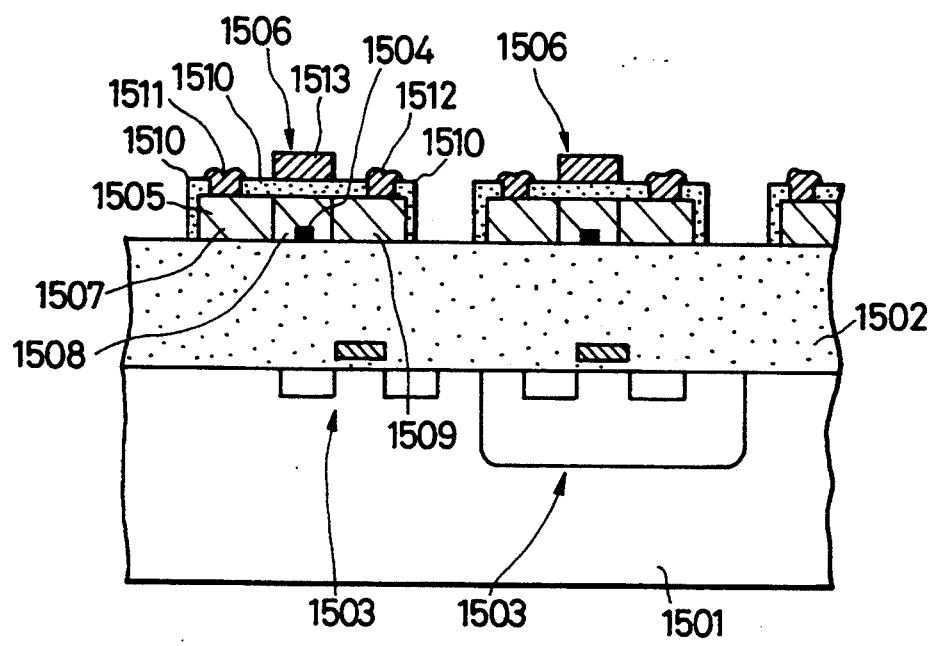
FIG. 15 is a schematic illustrative sectional view showing a multi-layer structure semiconductor device according to a first embodiment of the present invention.

FIG. 15 is a schematic illustrative sectional view showing a multi-layer structure semiconductor device according to a first embodiment of the present invention.

In FIG. 15, on a substrate 1501 in which electronic element such as transistor 1503 or the like is formed, a layer 1502 having a deposition surface ($S_{NDS}$) formed of small nucleation density material is formed. On a surface ($S_{NDL}$) of the layer 1502, nucleation surface [the deposition surface ($S_{NDL}$)] 1504 having sufficiently small area and being formed of greater nucleation density is located at a predetermined interval described as follows. Single crystal is grown with the surface 1504 as a center. Plurality of single crystal layers 1505 like an island are formed. Next, on each single crystal layer 1505, for example, in the present embodiment, thin film transistor 1506 is formed. Since the layer 1502 on which the transistor is formed is the insulating layer, the transistor has small parasitic capacitance therefore achieves high speed operation.

In the multi-layer structure semiconductor device as shown in FIG. 15, as the transistor 1503, for example, p-channel or n-channel MOS transistor is formed in the first layer (substrate) 1501 by conventional semiconductor process technique. Next, the single crystal layer 1505 of semiconductor material such as silicon or the like is formed by above described crystal producing technique.

When, as the thin film transistor 1506, for example, n-channel MOS transistor is selected, the single crystal layer 1505 can be formed as follows. P type impurity is injected into the single crystal layer 1505 by ion implantation technique or the like to selectively form P type semiconductor layers 1507 and 1509. Next, by injecting n-type impurity, n-type semiconductor layer 1508 is selectively formed.

Thus, the single crystal layer 1505 in which npn junction is formed is covered with electrically insulating layer 1510 such as SiO$_2$ or the like over the surface. Next, the insulating layer of the P type semiconductor layer 1507, 1509 is removed at predetermined position to expose the P type semiconductor layers 1507, 1509. At the exposed position, electrodes 1510, 1512 formed of metal such as Al or the like are provided.

On the insulating layer 1510 over the n type semiconductor 1508, a gate electrode 1506 is formed of metal such as Al or the like.

When, instead of n-channel MOS transistor, p-channel MOS transistor is produced, the conductivity type of the semiconductor materials used in the above processing are reversed. That is, the n type and p type semiconductor layers are altered respectively to p type and n type semiconductor layers.

Figure 16:
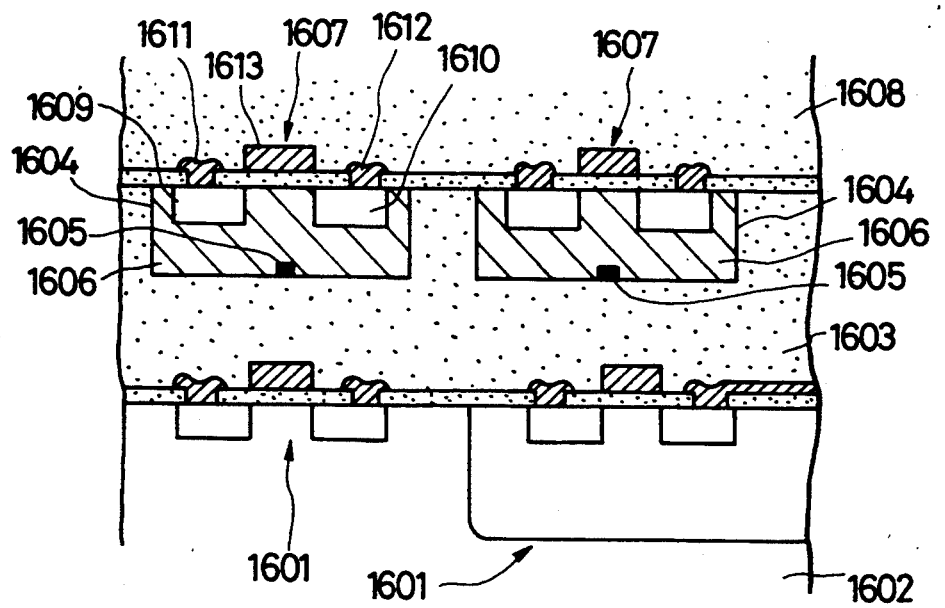
FIG. 16 is a schematic illustrative sectional view showing a multi-layer structure semiconductor device according to a second embodiment of the present invention.

FIG. 16 is a schematic illustrative sectional view showing a multi-layer structure semiconductor device according to a second embodiment of the present invention.

In FIG. 16, on a substrate 1602 as a first layer in which electronic elements such as transistor 1601 or the like are formed, a layers 1603 having deposition surfaces ($S_{NDS}$) formed by small nucleation density material is formed. At a concave portion 1604 of the layer 1603, a nucleation surface 1605 [a deposition surface ($S_{NDL}$)] having sufficiently small area and being formed of greater nucleation density material is formed. A single crystal layer 1606 is formed with nucleation surface 1605 as a center to fill and flatten the concave portion. In each single crystal layer 1606, a second layer in which electronic element such as transistor 1607 or the like is formed is formed by conventional semiconductor processing. Next, on the second layer, a third layer 1608, a fourth layer, . . . etc, can be produced by the same process as the second layer producing process.

Further, in the above first and second embodiment, also, polycrystalline layer can be formed on the layer 1608 having deposition surface ($S_{NDS}$) if desired.

The multi-layer structure semiconductor device as shown in FIG. 16 is a three dimensional semiconductor device with more than three layers (In FIG. 16, the embodiment of only two layers in which electronic elements are incorporated is shown.). In the substrate 1602 as the first layer of single crystal silicon or the like, the electronic element 1601 for example MOS transistor is formed as desired by conventional silicon semiconductor process technique. On the first layer, the second layer 1603 of insulating material such as SiO$_2$ or the like by PCVD process, sputtering process or the like technique. In the second layer 1603, concave portion 1604 of desired size is formed by selective etching process. As described in the above, the nucleation surface 1605 is formed. The single crystal layer 1606 such as single crystal silicon or the like is formed in the concave portion 1604 with the nucleation surface 1605 as a center.

In the single crystal layer 1606, an electronic element 1607, for example, n-channel or p-channel MOS transistor is formed by conventional semiconductor process technique.

For example, in case of p-channel MOS transistor, within the single crystal layer 1606, n type semiconductor regions 1609, 1610 are formed in the p type semiconductor region by ion implantation or diffusion process. Preliminary provided insulating oxide film such as SiO$_2$ or the like is removed at positions over the n type semiconductor regions 1609, 1610. At the positions, the electrodes 1611, 1612 formed of metal such as Al or the like are provided. On the insulating oxide film over the p-channel portion, the gate electrode 1613 formed of metal such as Al or the like is provided. Thus, the electronic element 1607 is formed in the second layer 1603. Then, over the second layer 1603, further, the third layer 1608 is formed by a process like the second layer producing process. In the third layer 1608, electronic element is formed like the second layer 1603.

Figure 17:
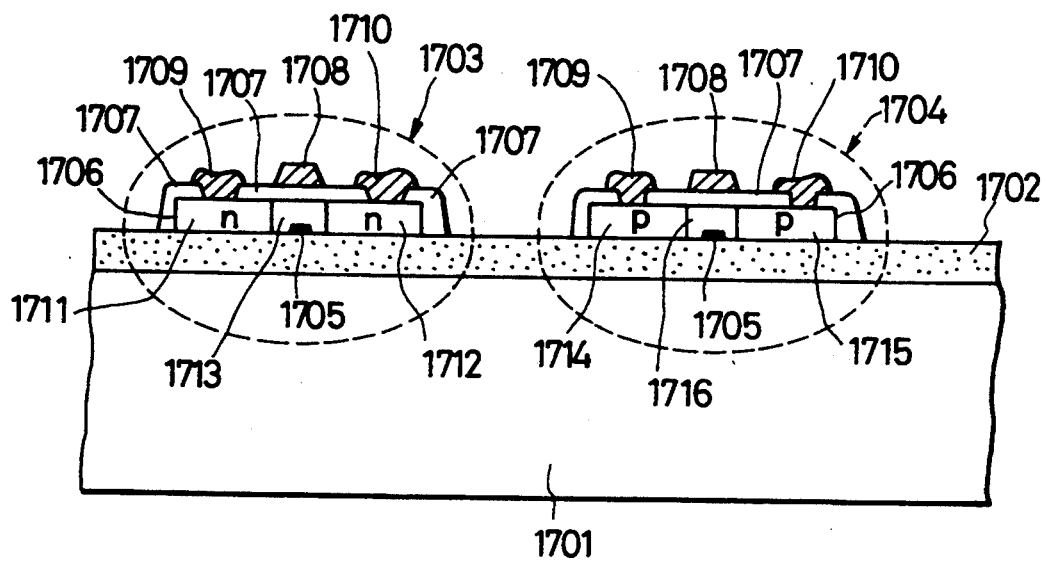
FIG. 17 is a schematic illustrative sectional view showing a semiconductor device according to a third embodiment of the present invention.

FIG. 17 is a schematic illustrative sectional view showing a semiconductor device according to a third embodiment of the present invention.

In FIG. 17, the substrate 1701 is made of desired materials such as semiconductor material and insulating material such as quartz, ceramic, or the like.

On a substrate 1701, an insulating layer 1702 formed of material having small nucleation density for growing the silicon is provided. As the material of the insulating layer 1702, SiO$_2$ is used in the present embodiment. SiO$_2$ is produced by oxidization or CVD process.

On the insulating layer 1702, n-channel MOS transistor 1703 and p-channel MOS transistor 1704 are formed. They constitute C-MOS. Producing process of transistors 1703 and 1704 is described as follows.

Firstly, on the insulating layer 1702, a material (Silicon nitride is used in the present embodiment.) of greater nucleation density than SiO$_2$ is provided. Next, the material is patterned to have a sufficiently small area approximately 1.0 μm square. Thereby, a nucleation region 1705 is formed. Further, the nucleation region 1705 may be formed by ion implantation as described in the above.

Next, single crystal silicon is grown with the nucleation region 1705 as a center at 700°~1000° C. by using H$_2$ gas as a carrier and SiHCl$_4$, SiHCl$_3$, etc. Such grown single crystal silicon is flattened to form a single crystal silicon layer 1706 like island.

Next, p type impurity ion and n type impurity ion are respecitvely independently implanted into a single crystal silicon layer 1706 in which a transistor 1703 is formed and a single crystal silicon 1706 in which a transistor 1704 is formed.

Next, a gate insulating film 1707 is formed on each single crystal silicon layer 1704. Further gate electrode 1708 of polycrystal silicon is formed by patterning. Next, n type impurity ion and p type impurity ion are implanted respectively into the transistor 1703 side and the transistor 1704 side by using the gate electrode 1708 as a mask. During next heating process, n diffusion regions 1711, 1712, and p diffusion regions 1714, 1715 are formed as source . drain region.

Simultaneously, p-channel region 1713 and n-channel region 1716 are also formed.

Finally, source . drain electrodes 1709 and 1710 and wiring are formed. n-channel MOS transistor 1703 and p-channel MOS transistor 1704 constituting C-MOS are formed.

Thus, resulted MOS transistor has much smaller floating capacitance of source and drain than that of conventional pn junction type one. Further, channel mobility for n-channel MOS transistor 1703 is greater than 400 cm$^2$/V.sec. And, channel mobility for p-channel MOS transistor 1704 is greater than 200 cm$^2$/v.sec. The mobility is approximated the same value as that of a transistor formed on a silicon wafer. This fact proves that high quality single crystal silicon is obtained by the above selective crystal growth.

Further, though MOS transistors are provided to constitute C-MOS in the present embodiment, of cource, the present invention is not limited to the C-MOS embodiment. For example, independently provided MOS transistor can be produced. Further, the present invention is applicable not limited to MOS transistor but to any insulated gate type transistor suitable for large scale integration.

Figure 18:
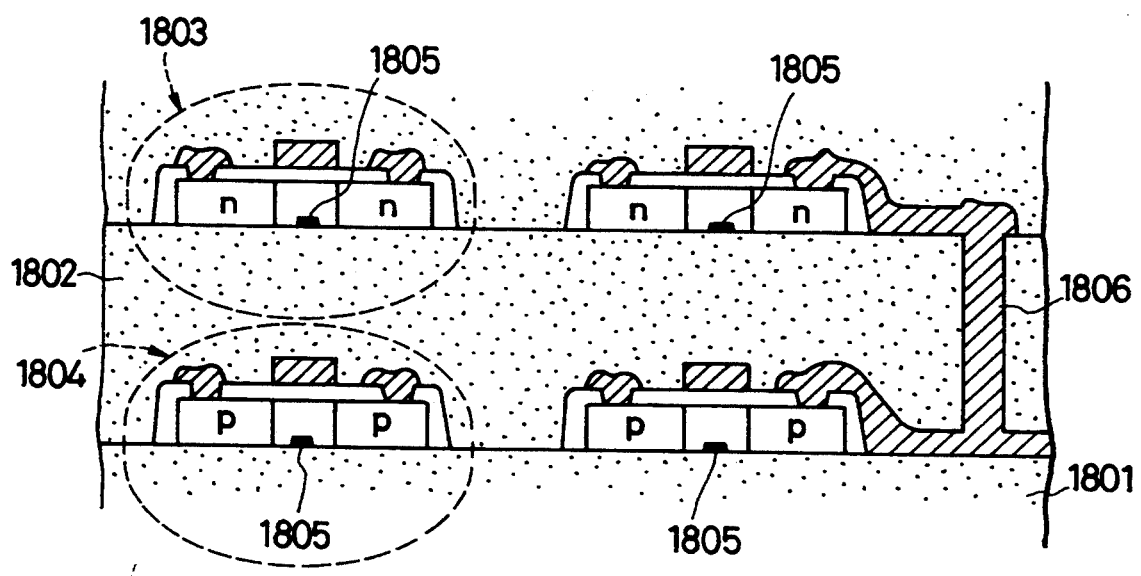
FIG. 18 is a schematic illustrative sectional view showing a fourth embodiment of the present invention.

FIG. 18 is a schematic illustrative sectional view showing a fourth embodiment of the present invention. Like the present embodiment, MOS transistor can be produced by forming an inter-layer insulating layer 1802 of SiO$_2$ on an underlayer 1801 in which MOS transistor is formed, and conducting a process like that for producing the under layer 1801. Further, a contact hole through the inter-layer insulating layer 1802 is formed. MOS transistor 1803 is connected via the hole to MOS transistor 1804 in the underlayer. By repeating such process, three dimensional integration with more than two layers can be readily produced.

Further, in case of multi-layer structure, n-channel and p-channel transistors can be formed in different layers respectively.

Further, since the single crystal silicon layer is formed at low temperature approximately 700°~1000° C., no performance deterioration of underlayer element is caused.

We claim:

1. A method for producing C-MOS transistor comprising the steps of:
    i) forming a first conductivity type MOS transistor on a substrate surface;
    ii) forming an insulating film on the formed MOS transistor and the substrate, wherein a nucleation surface and a non-nucleation surface are formed on a surface of the insulating film above the location of the first conductivity type MOS transistor, wherein the nucleation surface comprises an amorphous insulating material, wherein the nucleation density at the nucleation surface is sufficiently greater than that at the nonnucleation surface, and wherein a size of the nucleation surface is sufficiently smaller than that of the nonnucleation surface;
    iii) forming a nucleus on the nucleation surface according to a vapor deposition process;
    iv) growing a single crystalline semiconductor body from the nucleus, the single crystalline semiconductor body having a flat surface, thereby forming a single crystalline semiconductor layer on a surface of the insulating film above the location of the first conductivity type MOS transistor;
    v) forming in the single crystalline semiconductor layer a second conductivity type MOS transistor, different from the first conductivity type MOS transistor, insulatively separated therefrom, wherein the nucleation surface is at a position outside of a main electrode region of the second conductivity MOS transistor; and
    vi) connecting the first conductivity type MOS transistor via a wiring.

2. A method for producing a first conductivity type MOS transistor and a second conductivity type MOS transistor, insulatively isolated, said method comprising steps of:
    i) forming a nucleation surface and a nonnucleation surface on a substrate having an insulating film, wherein the nucleation surface and the nonnucleation surface are formed on a surface of the insulating film above a location at which the first conductivity type MOS transistor is formed on the substrate, wherein the nucleation surface comprises an amorphous insulating material, wherein the nucleation density at the nucleation surface is sufficiently greater than that at the nonnucleation surface, and wherein a size of the nucleation surface is sufficiently smaller than that of the nonnucleation surface;
    ii) forming a nucleus on the nucleation surface according to a vapor deposition process;
    iii) growing a single crystalline semiconductor body from the nucleus, the single crystalline semiconductor body having a flat surface, thereby forming a single crystalline semiconductor layer on a surface of the insulating film above the location of the first conductivity type MOS transistor; and
    iv) forming the second conductivity type MOS transistor on the single crystalline semiconductor layer, wherein the nucleation surface is positioned below a channel region of the second conductivity type MOS transistor.

* * * * *

UNITED STATES PATENT AND TRADEMARK OFFICE
CERTIFICATE OF CORRECTION

PATENT NO. : 5,422,302

DATED : June 6, 1995

INVENTOR(S) : TAKAO YONEHARA ET AL.

It is certified that error appears in the above-indentified patent and that said Letters Patent is hereby corrected as shown below: On the title page:

[73] ASSIGNEE

Insert --[73] Assignee: Canon Kabushiki Kaisha, Tokyo, Japan--.

[76] INVENTOR

"both of c/o Canon Kabushiki Kaisha, 30-2, 3-chome, Shimomaruko, Ohta-ku, Tokyo, Japan" should read --Yokohama, both of Japan--.

COLUMN 1

Line 31, "latch up" should read --latch-up--;

Line 57, "three dimen-" should read --three-dimen- --; and

Line 63, "three dimensional" should read --three-dimensional--.

COLUMN 4

Line 11, "nucleus" (both occurrences) should read --nuclei--.

UNITED STATES PATENT AND TRADEMARK OFFICE
CERTIFICATE OF CORRECTION

PATENT NO. : 5,422,302
DATED : June 6, 1995
INVENTOR(S) : TAKAO YONEHARA ET AL.

It is certified that error appears in the above-indentified patent and that said Letters Patent is hereby corrected as shown below:

COLUMN 4

Line 32, "nucleus" should read --nuclei--; and

Line 33, "nucleus" should read --nuclei--.

COLUMN 5

Line 56, "(AND)," should read --($\Delta$ND)--.

COLUMN 7

Line 36, "minimum. For," should read --minimum, for--.

COLUMN 8

Line 12, "8-1C First," should read --8-1C. First,--;

Line 21, "And," should read --Also,--; and

Line 34, "And," should read --Also,--.

UNITED STATES PATENT AND TRADEMARK OFFICE
CERTIFICATE OF CORRECTION

PATENT NO. : 5,422,302

DATED : June 6, 1995

INVENTOR(S) : TAKAO YONEHARA ET AL.

It is certified that error appears in the above-indentified patent and that said Letters Patent is hereby corrected as shown below:

COLUMN 9

Line 49, "abut" should read --about--.

COLUMN 12

Line 48, "9.7x10-atoms" should read --$9.7 \times 10^{14}$-atoms--.

COLUMN 13

Line 26, "micrometer" should read --micrometers--.

COLUMN 17

Line 47, "cource," should read --course,--;

Line 59, "under layer" should read --underlayer--; and

Line 64, "three dimensional" should read --three-dimensional--.

UNITED STATES PATENT AND TRADEMARK OFFICE
CERTIFICATE OF CORRECTION

PATENT NO. : 5,422,302
DATED : June 6, 1995
INVENTOR(S) : TAKAO YONEHARA ET AL.

It is certified that error appears in the above-indentified patent and that said Letters Patent is hereby corrected as shown below:

COLUMN 18

Line 6, "C-Mos" should read --a C-MOS--;

Line 12, "non-nucleation" should read --nonnucleation--; and

Line 41, "steps" should read --the steps--.

Signed and Sealed this

Fifth Day of March, 1996

Attest:

BRUCE LEHMAN

Attesting Officer

Commissioner of Patents and Trademarks